United States Patent
Kang et al.

(10) Patent No.: US 8,153,521 B2
(45) Date of Patent: Apr. 10, 2012

(54) WAFER-LEVEL STACK PACKAGE

(75) Inventors: Sun-Won Kang, Seoul (KR);
Seung-Duk Baek, Hwaseong-si (KR)

(73) Assignee: SAMSUNG Electronics Co., Ltd.,
Suwon-si (KR)

( * ) Notice: Subject to any disclaimer, the term of this patent is extended or adjusted under 35 U.S.C. 154(b) by 0 days.

(21) Appl. No.: 12/962,934

(22) Filed: Dec. 8, 2010

(65) Prior Publication Data

US 2011/0076803 A1    Mar. 31, 2011

Related U.S. Application Data

(62) Division of application No. 12/342,689, filed on Dec. 23, 2008, now abandoned.

(30) Foreign Application Priority Data

Dec. 27, 2007  (KR) ................................ 2007-138431

(51) Int. Cl.
*H01L 21/50* (2006.01)

(52) U.S. Cl. ........ 438/667; 257/621; 257/686; 257/777; 257/E23.011; 257/E23.067; 257/E23.141; 257/E23.145; 257/E21.499; 438/106; 438/107; 438/675

(58) Field of Classification Search .................. 257/621, 257/686, 774, 777, E23.011, E23.067, E23.141, 257/E23.145, E21.499; 438/106, 107, 667, 438/675
See application file for complete search history.

(56) References Cited

U.S. PATENT DOCUMENTS

| 5,481,133 | A | * | 1/1996 | Hsu | 257/621 |
| 6,448,661 | B1 | * | 9/2002 | Kim et al. | 257/777 |
| 6,566,232 | B1 | * | 5/2003 | Hara et al. | 438/455 |
| 6,593,645 | B2 | * | 7/2003 | Shih et al. | 257/686 |
| 2004/0157410 | A1 | * | 8/2004 | Yamaguchi | 438/460 |
| 2006/0051896 | A1 | * | 3/2006 | Meadows | 438/109 |
| 2006/0231928 | A1 | * | 10/2006 | Dotta et al. | 257/621 |
| 2008/0272465 | A1 | * | 11/2008 | Do et al. | 257/620 |

FOREIGN PATENT DOCUMENTS

| JP | 2004-152810 | 5/2004 |
| JP | 2004-152812 | 5/2004 |
| JP | 2006-228897 | 8/2006 |

* cited by examiner

Primary Examiner — Eugene Lee
Assistant Examiner — Peniel M Gumedzoe
(74) Attorney, Agent, or Firm — Stanzione & Kim, LLP

(57) ABSTRACT

A wafer-level stack package includes semiconductor chips, first connection members, a second connection member, a substrate and an external connection terminal. The semiconductor chips have a power/ground pad and a signal pad. The first connection members are electrically connected to the power/ground pad and the signal pad of each of the semiconductor chips. The second connection member is electrically connected to at least one of the power/ground pads of each of the semiconductor chips, the power/ground pads being connected to the first connection members. The substrate supports the stacked semiconductor chips, the substrate including wirings that are electrically connected to the first connection members and the second connection member. The external connection terminal is provided on a surface of the substrate opposite to a surface where the semiconductor chips are stacked, wherein the external connection terminals are electrically connected to the wirings, respectively.

10 Claims, 4 Drawing Sheets

WAFER-LEVEL STACK PACKAGE

CROSS-REFERENCE TO RELATED APPLICATIONS

This application is a Divisional Application of U.S. patent application Ser. No. 12/342,689, filed on Dec. 23, 2008 now abandoned, in the U.S. Patent and Trademark Office, which claims priority under 35 U.S.C. §119(a) to Korean Patent Application No. 2007-138431, filed on Dec. 27, 2007 in the Korean Intellectual Property Office (KIPO), the contents of which are herein incorporated by reference in their entirety.

BACKGROUND

1. Field of the Invention

Example embodiments relate to a wafer-level stack package and a method of manufacturing a wafer-level stack package. More particularly, example embodiments relate to a wafer-level stack package including semiconductor chips processed at the wafer level and a method of manufacturing the wafer-level stack package.

2. Description of the Related Art

Semiconductor packages are becoming miniaturized and lightweight according to the miniaturization trend of electronic products using semiconductor devices. Examples of the miniaturized and lightweight semiconductor package may include a stack package. In the stack package, stacked semiconductor chips are mounted on a substrate to form one unit semiconductor chip package. Examples of the stack package may include a chip-level stack package and a wafer-level stack package. In the chip-level stack package, a wafer having circuit patterns is cut to form chips and then the chips are stacked and packaged. In the wafer-level stack package, wafers having circuit patterns are stacked and packaged. Accordingly, in the wafer-level stack package, a plurality of chips may be packaged at the same time.

The wafer-level stack package includes a plurality of conductive plugs that penetrate the stacked wafers. The conductive plug connects a circuit wiring of each of the stacked wafers to an external power source.

FIG. 1 is a cross-sectional view illustrating a conventional wafer-level stack package.

Referring to FIG. 1, the conventional wafer-level stack package 1 includes a substrate 10, semiconductor chips 20, an adhesive layer 30, a conductive plug 40 and an external connection terminal 50.

The substrate 10 includes a wiring 12. The semiconductor chips 20 are stacked at the wafer level. The semiconductor chips 20 respectively include pads 22. The conductive plug 40 penetrates the wafers 20 to electrically connect the wiring 12 and the pads 22. The conductive plug 40 penetrates the stacked semiconductor chips 20 to electrically connect a power/ground pad and a signal pad of each of the pads 22 to the wiring 12, respectively. The external connection terminal 50 is provided on a first surface of the substrate 10 opposite to a second surface of the substrate 10 where the semiconductor chips 20 are stacked. The adhesive layer 30 is disposed between the semiconductor chips 20 (wafers) and the substrate 10, as well as between the semiconductor chips 20 (wafers).

The conductive plug 40 has a diameter in the range of several to several tens of micrometers. Therefore, the conductive plug 40 has a relatively low capacitance structure with respect to a signal provided to the signal pad. However, the conductive plug 40 may act as a high inductance path for the power/ground pad. Thus, supply characteristics of a power/ground signal may be deteriorated.

SUMMARY

Example embodiments provide a wafer-level stack package capable of reducing the inductance of a wire through which a power/ground signal that is provided to a power/ground pad of a semiconductor chip.

Example embodiments also provide a method of manufacturing the wafer-level stack package.

Additional aspects and utilities of the present general inventive concept will be set forth in part in the description which follows and, in part, will be obvious from the description, or may be learned by practice of the general inventive concept.

According to some example embodiments, a wafer-level stack package includes semiconductor chips stacked on one another, first connection members electrically connected to the power/ground pad and the signal pad of each of the semiconductor chips, and a second connection member electrically connected to at least one of the power/ground pads of each of the semiconductor chips, the power/ground pads being connected to the first connection members.

In an example embodiment, the first connection members may be conductive plugs that respectively penetrate regions of the semiconductor chips where the power/ground pad and the signal pad are formed.

In another example embodiment, the second connection member may include at least one conductive pillar penetrating the semiconductor chips except in a region where the power/ground pad and the signal pad are formed and a rewiring provided in at least one of the semiconductor chips, the rewiring connecting the conductive pillar to the power/ground pad of each of the semiconductor chips.

The conductive pillar may be formed in a scribe lane region of the semiconductor chips to be cut.

In still another example embodiment, the wafer-level stack package may further include a substrate supporting the stacked semiconductor chips, the substrate including wirings that are electrically connected to the first connection members and the second connection member.

The first connection members and the second connection member connected to the same power/ground pad may be connected to the same wiring of the substrate.

The wafer-level stack package may further include external connection terminals provided on a surface of the substrate opposite to a surface where the semiconductor chips are stacked, wherein the external connection terminals are electrically connected to the wirings, respectively. The external connection terminals may include a solder ball, a metal pin, a metal land, etc.

According to some example embodiments, there is also provided a method of manufacturing a wafer-level stack package. In the method, a rewiring is formed in at least one of a plurality of semiconductor chips, the rewiring being connected to a power/ground pad of each of the semiconductor chips. The semiconductor chips are stacked on one another. First through-holes are formed to penetrate the power/ground pad and a signal pad of the stacked semiconductor chips, respectively. A second through-hole is formed to penetrate the stacked semiconductor chips, the second through-hole being connected to the rewiring. The first through-holes are filled with a conductive material to form first connection members. The second through-hole is filled with a conductive material to form a conductive pillar, to thereby to form a second connection member including the conductive pillar and the rewiring.

In an example embodiment, the first through-holes and the second through-hole may be formed by a laser drilling process, a reactive-ion etching (RIE) process or a photo-etching process.

In another example embodiment, the first through-holes and the second through-hole may be filled with a conductive material by a plating process or a chemical vapor deposition (CVD) process.

In still another example embodiment, the second through-hole may be formed in a scribe lane region of the semiconductor chips to be cut.

In still another example embodiment, the method may further include adhering the stacked semiconductor chips having the first and second connection members to a substrate having a plurality of wirings.

The first connection members and the second connection member connected to the same power/ground pad of the semiconductor chips may be connected to the same wiring of the substrate.

The method may further include adhering an external connection terminal to a surface of the substrate opposite to a surface where the semiconductor chips are adhered.

According to some example embodiments, a plurality of electrical paths to supply a power/ground signal to each of power/ground pads is provided in a wafer-level stack package. Accordingly, electrical supply characteristics of the power/ground signal may be improved to provide a wafer-level stack package having improved electrical properties.

According to some example embodiments, there is also provided a wafer-level stack package including a plurality of stacked semiconductor chips each including a power/ground pad and a signal pad, and a plurality of connections members electrically connected to each of the power/ground pads and at least one connection member electrically connected to the signal pad of each of the semiconductor chips.

The first and second groups of the plurality of connection members can provide separate connections, respectively, between the power/ground pads to external wirings of the wafer-level package.

The first and second groups of the plurality of connection members connected to the same power/ground pads are connected to the same external wirings.

According to some example embodiments, there is also provided a method of manufacturing a wafer-level stack package, including forming a rewiring in at least one of a plurality of semiconductor chips to connect with a power/ground pad of each of the semiconductor chips; stacking the semiconductor chips; forming first connection members to connect the power/ground pads and the signal pads of the stacked semiconductor chips; and forming a conductive pillar to connect the at least one rewiring.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE EMBODIMENTS

Figure 1:
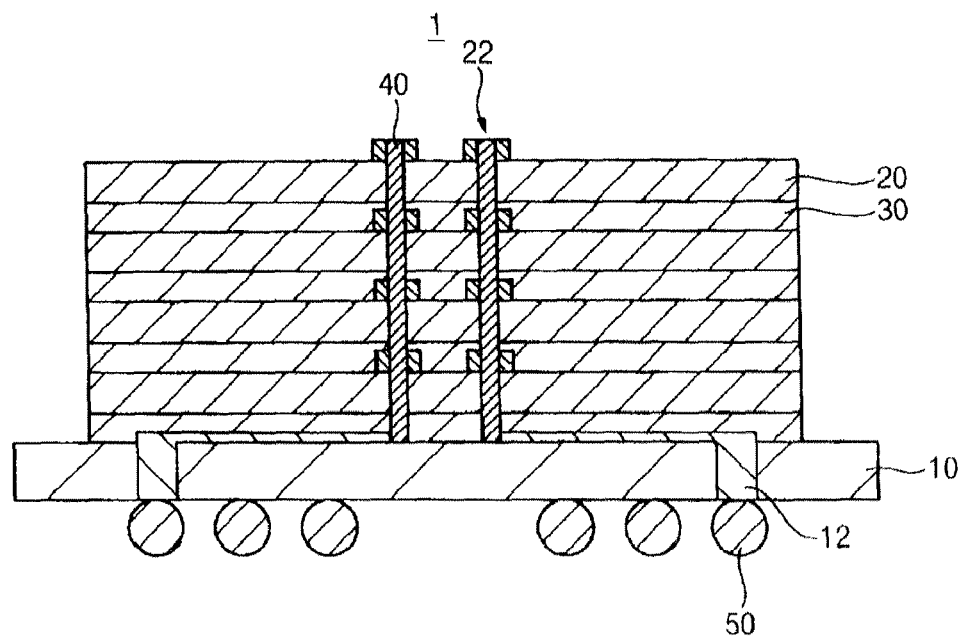
FIG. 1 is a cross-sectional view illustrating a conventional wafer-level stack package.

Various example embodiments will be described more fully hereinafter with reference to the accompanying drawings, in which some example embodiments are shown. The present general inventive concept may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present general inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present general inventive concept.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
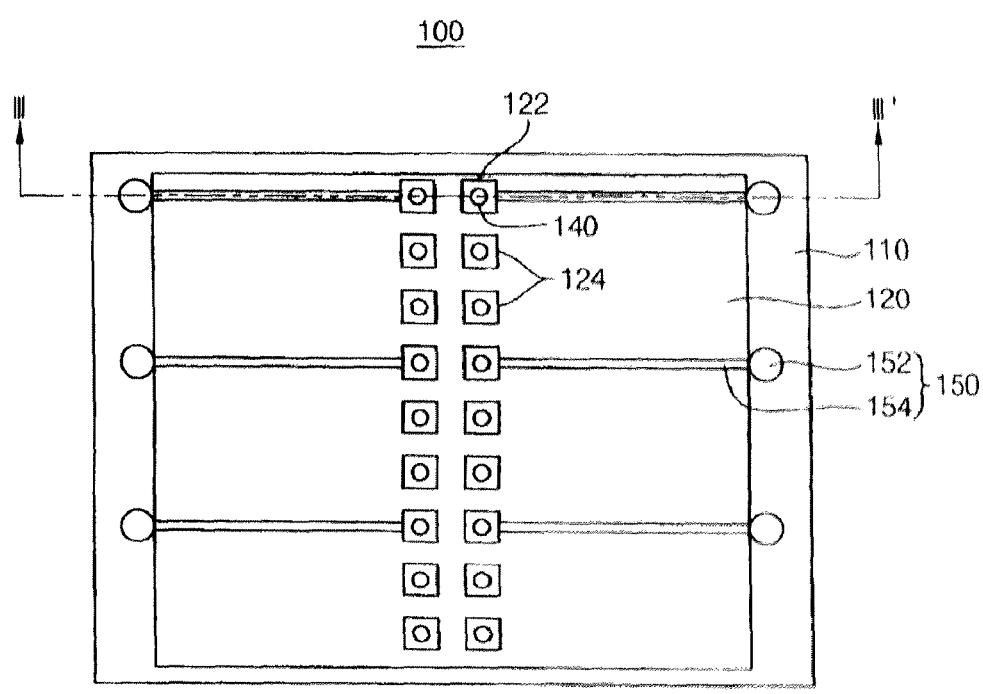
FIG. 2 is a plan view illustrating a wafer-level stack package in accordance with example embodiments.
Figure 3:
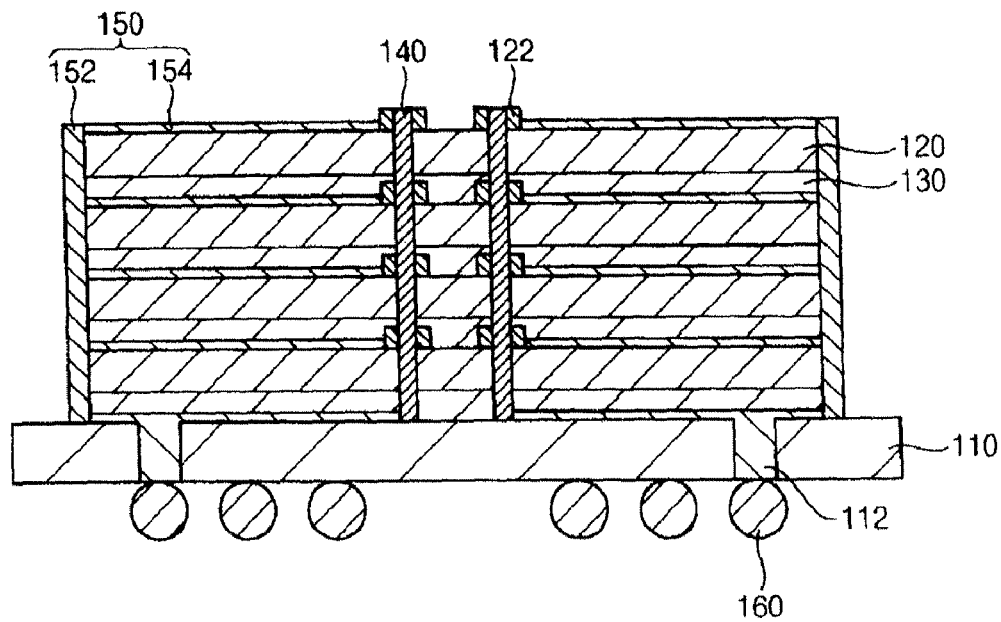
FIG. 3 is a cross-sectional view taken along a line III-III' in FIG. 2.

FIG. 2 is a plan view illustrating a wafer-level stack package in accordance with example embodiments. FIG. 3 is a cross-sectional view taken along a line III-III' in FIG. 2.

Referring to FIGS. 2 and 3, a wafer-level stack package 100 in accordance with an example embodiment includes a substrate 110, a semiconductor chip 120, an adhesive layer 130, first connection members 140, a second connection member 150 and an external connection terminal 160.

The substrate may have a plurality of wirings 112. The wirings 112 may be provided on an upper surface and a lower surface of the substrate 110. The wirings 112 may be provided to penetrate the substrate 110.

A plurality of the semiconductor chips 120 may be stacked on the substrate 110. Each of the semiconductor chips 120 has a power/ground pad 122 and a signal pad 124 formed on an active surface thereof. The power/ground pad 122 and the signal pad 124 may be arranged in the middle region or a peripheral region of the active surface.

When the semiconductor chips 120 are stacked on the substrate 110, the active surfaces of the stacked semiconductor chips 120 may face upward or downward. Alternatively, the active surfaces of the adjacent two semiconductor chips 120 may face each other.

For example, a first chip and a second chip of the semiconductor chips 120 may be the same type. In this case, the power/ground pad 122 and the signal pad 124 of the first chip may be positioned at the same locations as those of the second chip. Alternatively, the first chip and the second chip of the semiconductor chips 120 may be different types. In this case, the first and second chips may respectively have rewirings (not illustrated) to align the power/ground pad 122 and the signal pad 124 of the first chip with those of the second chip.

The first connection members 140 are electrically connected to the power/ground pad 122 and the signal pad 124 of each of the semiconductor chips 120, respectively. The first connection members 140 penetrate a first region of each of the semiconductor chips 120 where the power/ground pad 122 is formed and a second region of each of the semiconductor chips 120 where the signal pad 124 is formed, respectively. In other words, there are first connection members 140 that connect the power/ground pads 122 and first connection members 140 that connect the signal pads 124.

Accordingly, the number of the first connection members 140 may be the same as the number of the power/ground pads 122 and the signal pads 124 of each of the semiconductor chips 120. For example, the first connection members 140 may be conductive plugs that completely penetrate the stacked semiconductor chips 120. Alternatively, the first connection members 140 may include conductive plugs penetrating each of the semiconductor chips 120 and conductive bumps connecting the conductive plugs to each other.

The first connection members 140 are electrically connected to the wirings 112 of the substrate 110. Accordingly, the first connection members 140 connect the power/ground pad 122 and the signal pad 124 to the wirings 112 of the substrate 110.

The second connection member 150 is connected to at least one of the power/ground pads 122 of each of the semiconductor chips 120. The second connection member 150 may include a conductive pillar 152 and a rewiring 154.

At least one of the conductive pillars 152 may be provided in the wafer-level stack package 100. The conductive pillar 152 may penetrate the semiconductor chips 120 except in a region where the power/ground pad 122 is formed. For example, the region where the power/ground pad 122 is formed may be a scribe lane region for individually separating the semiconductor chips 120 from the wafer in which they are formed.

The number of the conductive pillars 152 may be greater than or equal to that of the power/ground pads 122 of the semiconductor chips 120. The conductive pillar 152 may completely penetrate the stacked semiconductor chips 120. Alternatively, the conductive pillars 152 may penetrate each of the semiconductor chips 120, and the penetrating conductive pillars 152 may be connected to one another by a conductive pump. Each conductive pillar 152 is electrically connected to the wirings 112 of the substrate 110.

The rewiring 154 may be provided in at least one of the semiconductor chips 120 to electrically connect the conductive pillar 152 to the power/ground pad 122 of each of the semiconductor chips 120. For example, the rewiring 154 may be provided on the active surfaces of the semiconductor chips 120. Alternatively, the rewiring 154 may be provided on a surface opposite to the active surface. Accordingly, each of the first connection members 140 connected to the power/ground pad 122 is electrically connected to the conductive pillar 152 by the rewiring 154.

When the number of the conductive pillars 152 is greater than or equal to that of the power/ground pads 122, the rewiring 154 may electrically connect two or more conductive pillars 152 to one power/ground pad 122.

The first connection members 140 and the second connection member 150 connected to the same power/ground pad 122 are connected to the same wiring 112. Accordingly, each of the power/ground pads 122 of each of the semiconductor chips 120 is connected to the first connection members 140 and the second connection member 150 to provide a plurality of electrical paths to supply a power/ground signal to one power/ground pad 122. Therefore, inductances of the first and second connection members 140 and 150 may be reduced.

The external connection terminal 160 is provided on a surface of the substrate 110 opposite to a surface where the semiconductor chips 120 are stacked. The external connection terminal 160 is electrically connected to the wiring 112. For example, the external connection terminal 160 may include a solder ball, a metal pin, a metal land, etc.

FIGS. 4A to 4E are cross-sectional views illustrating a method of manufacturing a wafer-level stack package in FIG. 2 in accordance with example embodiments.

Figure 4A:
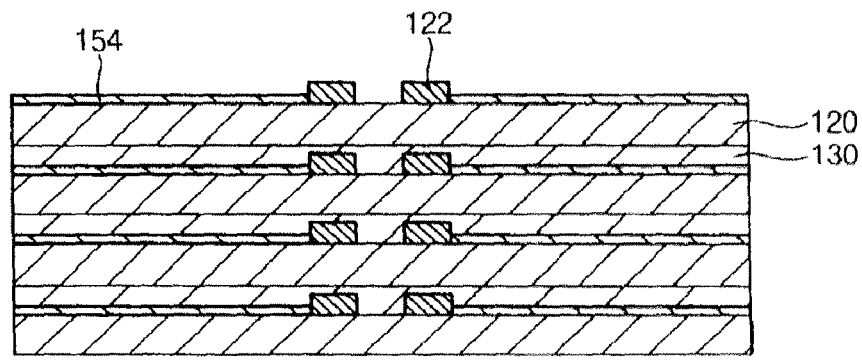
FIGS. 4A to 4E are cross-sectional views illustrating a method of manufacturing a wafer-level stack package in FIG. 2 in accordance with example embodiments.

Referring to FIG. 4A, a plurality of semiconductor chips 120 including a power/ground pad 122 and a signal pad 124 formed on an active surface thereof is prepared.

A rewiring 154 is formed in at least one of the semiconductor chips 120. For example, the rewiring 154 may be formed on the active surface to be connected to the power/ground pad 122. Alternatively, the rewiring 154 may be formed on a surface opposite to the active surface. The rewiring 154 may extend to a scribe lane region of each of the semiconductor chips 120.

The semiconductor chips 120 including the rewiring 154 are stacked. For example, when the semiconductor chips 120 are stacked on the substrate 110, the active surfaces of the stacked semiconductor chips 120 may face upward. Alternatively, the active surfaces of the stacked semiconductor chips 120 may face downward. Alternatively, the active surfaces of the adjacent two semiconductor chips 120 may face each other.

An adhesive layer 130 is formed between the semiconductor chips 120. The semiconductor chips 120 are adhered to and insulated from one another by the adhesive layer 130.

Figure 4B:
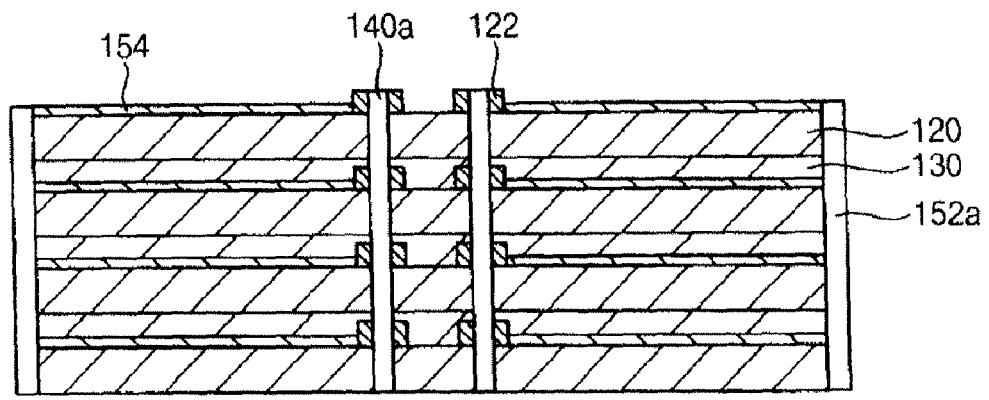

Referring to FIG. 4B, first through-holes 140a are formed to penetrate the stacked semiconductor chips 120. The first through-holes 140a may penetrate the power/ground pad 122 and the signal pad 124, respectively. When the rewiring 154 is formed on the surface of each of the semiconductor chips 120 opposite to the active surface, the first through-holes 140a may penetrate the rewiring 154. Additionally, a second through-hole 152a is formed in the scribe lane region of the semiconductor chips 120 to be cut.

The first through-holes 140a may be formed together with the second through-hole 152a. Alternatively, the first through-holes 140a and the second through-hole 152a may be sequentially formed in the semiconductor chips 120. For example, the first and second through-holes 140a and 152a may be formed by a laser drilling process, a reactive-ion etching (RIE) process, a photo-etching process, etc.

Figure 4C:
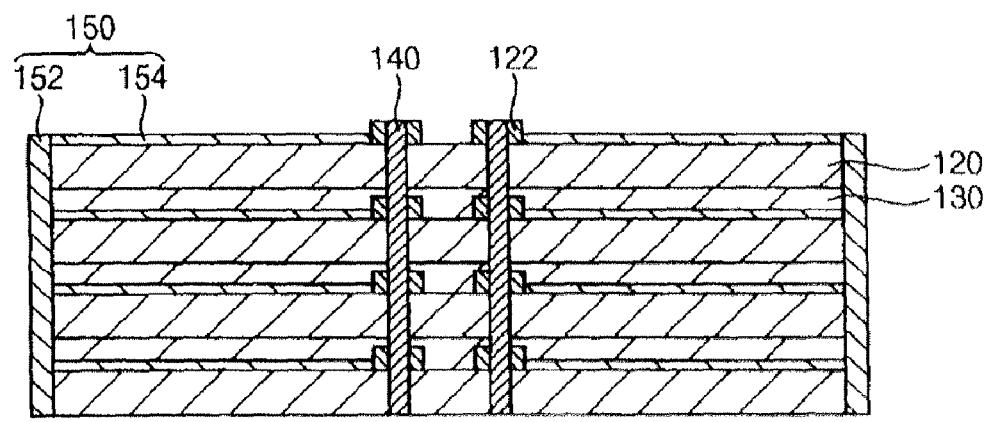

Referring to FIG. 4C, the first through-holes 140a are filled with a conductive material to form a first connection member 140 such as a conductive plug. The second through-hole 152a is filled with a conductive material to form a conductive pillar 152. Each of the conductive pillars 152 is electrically connected to the rewiring 154, to thereby form a second connection member 150 including the conductive pillar 152 and the rewiring 154. The first and second through-holes 140a and 152a may be filled with a conductive material by a plating process or a chemical vapor deposition (CVD) process.

Figure 4D:
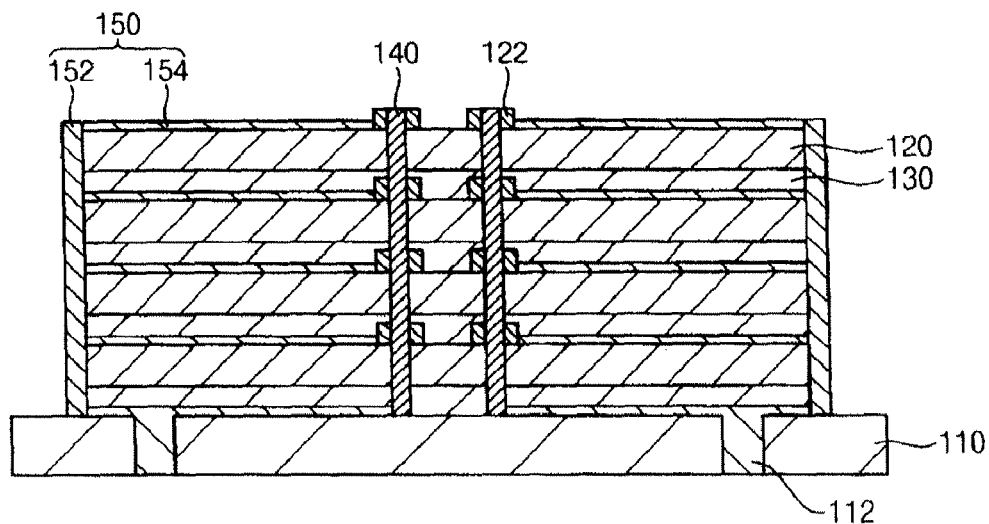

Referring to FIG. 4D, the stacked semiconductor chips 120 including the first connection member 140 and the second connection member 150 is adhered to the substrate 110 having a plurality of wirings 112. The wirings 112 may be provided on an upper surface and a lower surface of the substrate 110. The wirings 112 may be provided to penetrate the substrate 110. The first connection member 140 and the second connection member 150 are electrically connected to the wirings 112. In this case, the first connection member 140 and the second connection member 150 connected to the same power/ground pad 122 are connected to the same wiring 112.

Figure 4E:
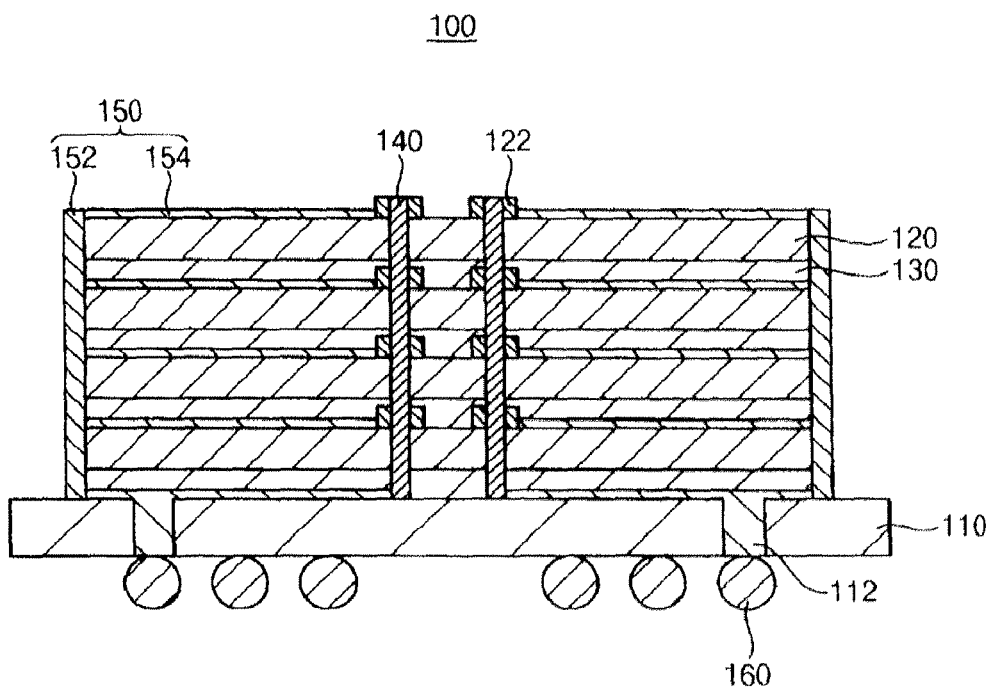

Referring to FIG. 4E, an external connection terminal 160 is formed on a surface of the substrate 110 opposite to a surface where the semiconductor chips 120 are stacked. The external connection terminal 160 is electrically connected to the wirings 112.

Alternatively, the external connection terminal 160 may be adhered to the substrate 110, before the stacked semiconductor chips 120 including the first and second connection members 140 and 150 are adhered to the substrate 110.

As mentioned above, according to some example embodiments, a plurality of electrical paths to supply a power/ground signal to each of power/ground pads is provided in a wafer-level stack package. Accordingly, electrical supply characteristics of the power/ground signal may be improved to provide a wafer-level stack package having improved electrical properties.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of manufacturing a wafer-level stack package, comprising:
   forming rewirings in at least one of a plurality of semiconductor chips, the rewirings being connected to pairs of power/ground pads of each of the semiconductor chips;
   stacking the semiconductor chips on one another;
   forming first through-holes that penetrate the power/ground pads and signal pads formed between the pairs of power/ground pads of the stacked semiconductor chips, respectively;
   forming a second through-hole that penetrates the stacked semiconductor chips, the second through-hole being connected to the rewirings;
   filling the first through-holes with a conductive material to form first connection members; and
   filling the second through-hole with a conductive material to form a conductive pillar, to thereby form a second connection member including the conductive pillar and the rewirings.

2. The method of claim 1, wherein the first through-holes and the second through-hole are formed by a laser drilling process, a reactive-ion etching (RIE) process or a photo-etching process.

3. The method of claim 1, wherein the first through-holes and the second through-hole are filled with a conductive material by a plating process or a chemical vapor deposition (CVD) process.

4. The method of claim 1, wherein the second through-hole is formed in a scribe lane region of the semiconductor chips to be cut.

5. The method of claim 1, further comprising:
   adhering the stacked semiconductor chips including the first and second connection members to a substrate having a plurality of wirings.

6. The method of claim 5, wherein the first connection members and the second connection member connected to the same power/ground pads of the semiconductor chips are connected to the same wiring of the substrate.

7. The method of claim 5, further comprising:
   adhering an external connection terminal to a surface of the substrate opposite to a surface where the semiconductor chips are adhered.

8. The method of claim 1, wherein the pairs of power/ground pads are formed at middle regions of each of the semiconductor chips.

9. The method of claim 1, wherein the signal pads are formed at middle regions of each of the semiconductor chips.

10. A method of manufacturing a wafer-level stack package, comprising:

forming a rewiring in at least one of a plurality of semiconductor chips, the rewiring being connected to a power/ground pad of each of the semiconductor chips;

stacking the semiconductor chips on one another;

forming first through-holes that penetrate the power/ground pads of the stacked semiconductor chips, respectively;

forming a second through-hole that penetrates the stacked semiconductor chips, the second through-hole being connected to the rewiring;

filling the first through-holes with a conductive material to form a first connection member;

filling the second through-hole with a conductive material to form a conductive pillar, to thereby form a second connection member including the conductive pillar and the rewiring; and adhering the stacked semiconductor chips including the first and second connection members to a substrate having a plurality of wirings, wherein the power/ground pad of each of the semiconductor chips is connected in parallel to the same wiring of the substrate through the first connection member and the second connection member so that a power/ground signal is supplied from the same wiring of the substrate to the power/ground pad through the first connection member and the second connection member as at least two electrical paths.

* * * * *